US009460247B2

(12) United States Patent
Bashore et al.

(10) Patent No.: US 9,460,247 B2
(45) Date of Patent: *Oct. 4, 2016

(54) MEMORY FRAME ARCHITECTURE FOR INSTRUCTION FETCHES IN SIMULATION

(71) Applicant: INTERNATIONAL BUSINESS MACHINES CORPORATION, Armonk, NY (US)

(72) Inventors: Tracy Bashore, Rochester, MN (US); Ahmed Gheith, Austin, TX (US); Aditya Kumar, Austin, TX (US); Ronald L. Rockhold, Satellite Beach, FL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 452 days.

This patent is subject to a terminal disclaimer.

(21) Appl. No.: 14/090,052

(22) Filed: Nov. 26, 2013

(65) Prior Publication Data

US 2014/0163947 A1 Jun. 12, 2014

Related U.S. Application Data

(63) Continuation of application No. 13/707,728, filed on Dec. 7, 2012, now Pat. No. 9,317,630.

(51) Int. Cl.

| | |
|---|---|
| ***G06F 9/45*** | (2006.01) |
| ***G06F 17/50*** | (2006.01) |
| ***G06F 9/455*** | (2006.01) |

(52) U.S. Cl.

CPC .......... *G06F 17/5009* (2013.01); *G06F 9/455* (2013.01); *G06F 17/5022* (2013.01)

(58) Field of Classification Search

CPC . G06F 17/5009; G06F 9/455; G06F 17/5022

USPC .......................................................... 703/22

See application file for complete search history.

(56) References Cited

U.S. PATENT DOCUMENTS

| | | | |
|---|---|---|---|
| 5,440,727 | A | 8/1995 | Bhide et al. |
| 5,617,553 | A | 4/1997 | Minagawa et al. |

(Continued)

OTHER PUBLICATIONS

Office Action in U.S. Appl. No. 13/707,728 mailed on Aug. 21, 2015, 9 pages (pp. 1-9 in pdf).

(Continued)

*Primary Examiner* — Dwin M Craig

(74) *Attorney, Agent, or Firm* — Mitch Harris, Atty at Law, LLC; Andrew M. Harris; Joseph J. Petrokaitis

(57) ABSTRACT

A simulation technique that handles accesses to a frame of instruction memory by inserting a command object between a frame proxy and a memory frame provides improved throughput in simulation environments. The instruction frame, if present, processes the access to the frame. If an instruction frame is not present for the accessed frame, the memory frame handles the request directly. The instruction frame caches fetched and decoded instructions and may be inserted at the first access to a corresponding instruction memory frame. The instruction frame can track write accesses to instruction memory so that changes to the instruction memory can be reflected in the state of the instruction frame. Additional check frames may be chained between the interface and the memory frame to handle breakpoints, instruction memory watches or other access checks on the instruction memory frame.

7 Claims, 4 Drawing Sheets

Simulator 10 — 12 — Frame Proxy 16 — Instruction Frame 18A — Instruction Memory Frame 18 — Other frames

(56) References Cited

U.S. PATENT DOCUMENTS

| | | | |
|---|---|---|---|
| 5,895,490 | A | 4/1999 | Ramsey |
| 7,165,201 | B2 | 1/2007 | Groz et al. |
| 7,184,944 | B1 | 2/2007 | Rieschl et al. |
| 7,596,654 | B1 | 9/2009 | Wong |
| 7,818,513 | B2 | 10/2010 | Moir |
| 7,877,659 | B2 | 1/2011 | Geller et al. |
| 8,086,438 | B2 | 12/2011 | Nohl et al. |
| 8,090,935 | B2 | 1/2012 | Anwar et al. |
| 8,103,838 | B2 | 1/2012 | Dice et al. |
| 8,176,279 | B2 | 5/2012 | Farrell et al. |
| 8,176,280 | B2 | 5/2012 | Farrell et al. |
| 8,209,499 | B2 | 6/2012 | Chou |
| 8,209,689 | B2 | 6/2012 | Raikin et al. |
| 8,364,912 | B2 | 1/2013 | Farrell et al. |
| 8,677,077 | B2 | 3/2014 | Farrell et al. |
| 8,972,670 | B2 | 3/2015 | Farrell et al. |
| 9,317,630 | B2 * | 4/2016 | Bashore .............. G06F 17/5009 |
| 2005/0015754 | A1 | 1/2005 | Werner et al. |
| 2008/0208558 | A1 | 8/2008 | Wang et al. |

OTHER PUBLICATIONS

U.S. Appl. No. 13/707,728, filed Dec. 7, 2012, Bashore, et al.

* cited by examiner

MEMORY FRAME ARCHITECTURE FOR INSTRUCTION FETCHES IN SIMULATION

The present application is a Continuation of U.S. patent application Ser. No. 13/707,728, filed on Dec. 7, 2012, and claims priority thereto under 35 U.S.C. 120. The disclosure of the above-referenced parent U.S. patent application is incorporated herein by reference.

BACKGROUND OF THE INVENTION

1. Field of the Invention

The present invention is related to memory access management, and in particular, to an architecture using a memory frame proxy for accesses to instruction memory in a simulation environment.

2. Description of Related Art

Simulators, debuggers and accelerators that can be implemented in hardware, software or a combination of both, are typically used in verification of program code as well as verification of designs of processor integrated circuits (ICs) and other large-scale logic.

The simulation of instruction fetches and decodes is a compute-intensive task, since each time an access to instruction memory is made by simulated pipeline, if the instruction must be fetched from the simulated instruction memory, the instruction must be decoded, and checks must be performed if there are any associated with the instruction location or operands implicated by the instruction.

Caching of simulations of instruction memory is not a viable technique where instruction memory may be moved by another process, or where self-modifying code may alter the values stored in instruction memory. Therefore, the fetching and decoding of instructions represents a serious bottleneck in simulation throughput and it is desirable to improve the performance simulators, debuggers and the link.

BRIEF SUMMARY OF THE INVENTION

The invention is embodied in a computer-performed method that simulates accesses to instruction memory.

The method simulates accesses to a frame of instruction memory by using proxy frames to receive accesses to instruction memory frames in a memory subsystem. An instruction frame can be inserted in a linked list between a proxy frame and the corresponding memory frame, along with other check frames such as breakpoint frames, to handle processing of instruction fetches and other accesses to the corresponding instruction memory frame. If an instruction frame is not present for the accessed frame, the memory frame handles the request directly. The instruction frame may be inserted at the first access to the instruction memory frame and may cache fetched and decoded instructions. The instruction frame can track write accesses to instruction memory so that changes to the instruction memory can be reflected in the state of the instruction frame. Additional check frames may be chained between the interface and the memory subsystem to handle breakpoints, instruction memory watches or other accesses to the instruction memory frame. As execution proceeds, the instruction frame may store pointers to a next decoded instruction from a given non-branch instruction so that completion of processing does not require determining a next instruction to execute, nor re-entry of the instruction frame.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses computer-performed methods and programs for simulating execution of program code by a processor. Accesses to instruction memory are made from a memory interface frame proxy, which may be an object, a function or another code entry point at which the simulator obtains the value of a location (generally an instruction or op-code) in instruction memory in order to simulate execution of the instruction. An instruction frame may be inserted between the frame proxy and the instruction memory frame, which is generally a data page managed by the simulation program that contains the code for the memory frame being simulated. For the purposes of illustration, it can be assumed the frame size, the page size of the simulating system and the page size of the system being simulated are the same, but differences in page size can be accommodated by appropriate mapping in the simulator and the frame size may be multiple pages or multiple frames can be provided per page.

An instruction frame is generally inserted in the chain between the frame proxy and the instruction memory frame at a first access to an instruction memory frame and may be retired as needed to conserve resources in the simulator, for example on a most-recently-accessed basis. The instruction frame stores fetched and decoded instructions so that fetching and decoding does not have to be repeated for each execution of a given instruction, while maintaining coherency in the face of self-modifying code or other operations that might corrupt the underlying instruction memory frame, since all accesses to the instruction memory frame will be processed by the instruction frame once it is inserted between the frame proxy and the memory frame. One or more check frames may be inserted for a given memory frame, the arrangement of which can be maintained via a linked list. Functions such as breakpoints or instruction memory watches can be implemented and easily inserted and removed by inserting independent check frames corresponding to those functions.

Figure 1:
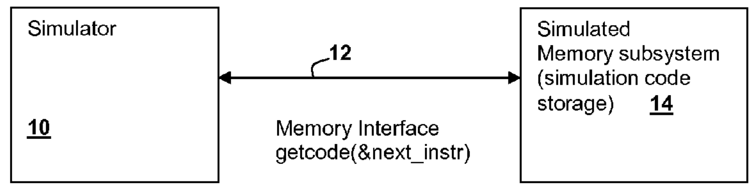
FIG. 1 is a pictorial diagram depicting a simulation architecture in which the techniques disclosed herein can be practiced in accordance with embodiments of the invention.

Referring now to FIG. 1, a simulation architecture is shown, in which techniques according to embodiments of the invention can be practiced. A simulator 10, i.e., a simulation program, implements a memory interface 12, through which code storage of a simulated memory subsystem 14 is accessed. Simulated memory subsystem 14 is controlled by simulator 10 that contains stored values that represent the contents of memory that is being simulated along with one or more simulated processors that access the memory. The simulated memory may be data and instruction memory combined, but what is of concern in the present example is instruction memory storage. Memory interface 12 is illustrated as a getcode (&next_instruction) interface that corresponds to an instruction fetch, which is performed by a simulated processor. In the present invention, as will be illustrated in further detail below, a frame proxy can implement memory interface 12, and one or more command and check frames can be chained between memory interface 12 and simulated memory subsystem 14, so that simulation can be accelerated and breakpoints, watches, protection and other mechanisms that require special handling can be implemented. Each frame of memory simulated by simulated memory subsystem 14 can have a frame proxy and one or more special handling frames chained between memory interface 12 and memory frames in simulated memory subsystem 14, which generally correspond to memory pages in the simulated computer system, but that may be alternatively larger or smaller than a page. The per-frame insertion of frame proxies provides direct access for frames that have no special handling, so that throughput is maximized, because no special checks are required to determine if special handling is required for that frame.

Figure 2A:
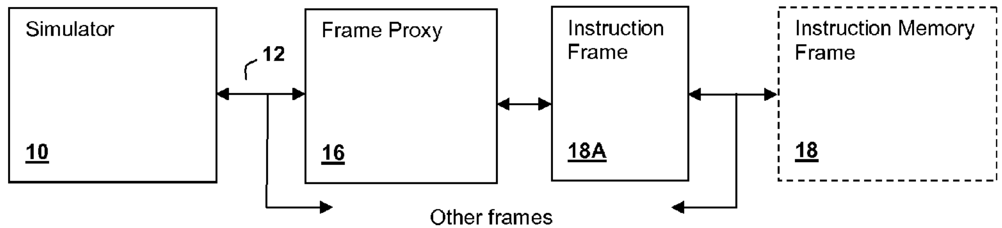
FIG. 2A and FIG. 2B are pictorial diagrams of simulated instruction memory access paths in the simulation architecture of FIG. 1.

Referring now to FIG. 2A, a simulated memory access path for an instruction memory frame within the simulation environment of FIG. 1 is shown. Each frame of simulated instruction memory subsystem 14 has a corresponding entry to a linked list that may point directly to an instruction memory frame 18 within simulated instruction memory subsystem 14, or that may contain a linked-list of one or more handling frames headed by a frame proxy 16. The illustrated access path is for only one particular frame of memory; other memory frames have their own linked list of proxy objects. Frame proxy 16 receives requests for access to a particular frame of simulated instruction memory subsystem 14, i.e., instruction fetch requests, and generally handles those requests by storing previously fetched and decoded instructions within an instruction frame 18A. The instructions are stored within instruction frame 18A so that instructions do not have to be fetched from simulated instruction memory subsystem 14 and decoded each time the instructions are executed. Instruction frame 18A is generally inserted in the chain between proxy frame 16 and instruction memory frame 18 at the first fetch of an instruction stored in instruction memory frame.

Figure 2B:
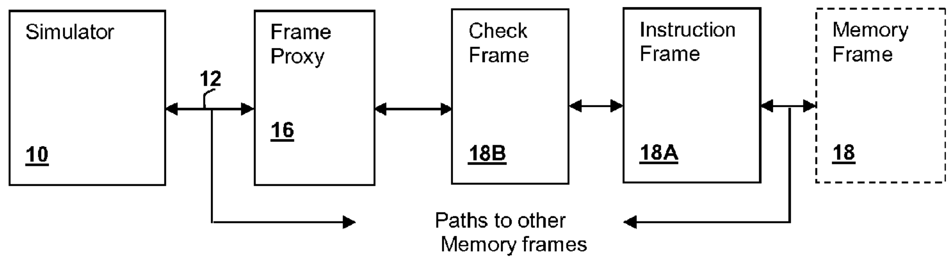

Referring to FIG. 2B, an access path for a memory frame for which another special handling frame: check frame 18B has been inserted between frame proxy 16 and instruction frame 18A. Check frame 18B performs special handling for memory frame 18 such as checks, e.g., breakpoint handling, then passes the access request through to instruction frame 18A, which provides a decoded program instruction and next instruction pointer result for non-branch instructions. In each of the cases shown in FIG. 2A and FIG. 2B, access to simulated memory subsystem 14 may or may not be required, since if instruction frame 18A is present and the instruction has been previously executed, a decoded instruction corresponding to the program instruction at the requested memory location is cached at a location referenced in instruction frame 18A.

Figure 3A:
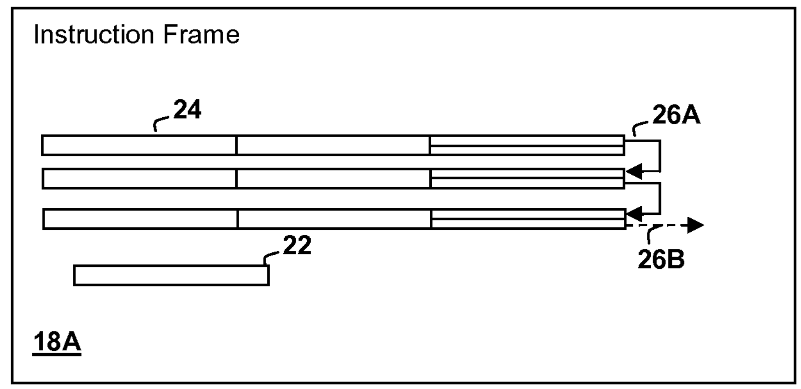
FIG. 3A is a pictorial diagram depicting an architecture of instruction frame 18 of FIGS. 2A-2B and FIG. 3B is a pictorial diagram depicting an architecture of check frame 18A of FIG. 2B.

Referring now to FIG. 3A, an architecture of instruction frame 18A of FIGS. 2A-2B is shown in accordance with an embodiment of the present invention. Instruction frame 18A is not a breakpoint, watch or protection object, and thus contains decoded program instructions according to the examples given herein. As instruction frame 18A is populated with decoded non-conditional-branch program instructions, entries are placed in table 24, which may be generated according to the following example:

| Location | Decoded instruction | Next instruction entry |
|---|---|---|
| Address1 | Decode 1 | &next_instruction1 (&branch_to1) |
| Address2 | Decode 2 | &next_instruction2 (&branch_to2) |
| Address 3 | Decode 3 | &next_instruction2 (&branch_to3) |

The next instruction pointers are generally indices or pointers to other entries in table 24, which are generally populated in advance for the instruction frame, so that storage for decoded instructions does not have to be allocated on-the-fly and the next instruction pointers are already initialized. Once the instruction frame and associated storage are set up, as the simulation proceeds, instructions are decoded and the results cached. If the instructions have already been decoded, the previous decoding results are available for use without reference to the underlying memory. Next instruction reference 26A illustrates a next instruction reference that points to another entry in table 24. Also included in table 24 for branch instructions, is a "branch-to" pointer 26B which points to an entry in table 24 or another location, at which a decoded instruction for the non-sequential next instruction executed when the branch condition is true. The memory frame has a run( ) method that is valid for both decoded instructions and "dynamic" instructions (instructions that have not been decoded). Both types of instruction objects implement the run( ) method, so that once a pointer to the object representing the instruction is obtained, i.e., via the next_instruction pointer, the run( ) method can be invoked with no penalty for checking for a decoded instruction. The availability of the next_instruction pointer for all cases saves a fetch operation. If the instruction has not been decoded, the run method causes execution of the program code needed to fetch the instruction, decode the instruction, and update the corresponding entries in table 24. Instruction frame 18A also contains next object pointer 22, which indicates a next proxy object in the linked list to which to pass the request after processing by instruction frame 18A is complete.

Figure 3B:
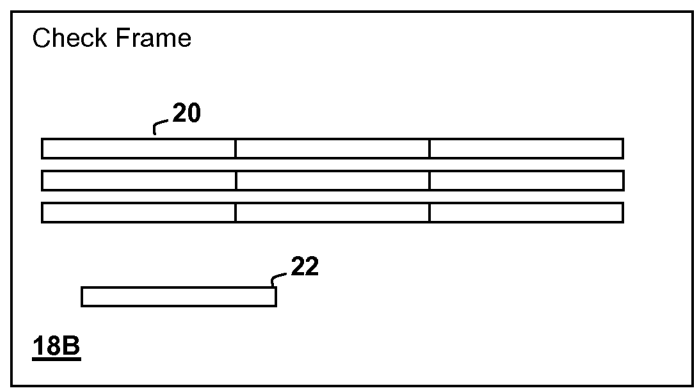

Referring now to FIG. 3B, an architecture of check frame 18B of FIG. 2B is shown in accordance with an embodiment of the present invention. Check frame 18B contains a table 20 with special handling entries of the form:

| Location | Type | Handler |
|---|---|---|
| Address1 | Breakpoint | &breakpoint_handler |
| Address 2 | Instruction memory watch | &watch_handler |
| Address 3 | Exception | &exception_handler |

CHECK frame 18B further contains a next object pointer 22, which can be placed in an upstream object's next object pointer when check frame 18B is removed from a chain of special handling frames, since the chain of special handing frames forms a linked list with next object pointer 22 providing the link. The above is only an example of a data structure that can be used within check frame 18B to represent special handling operations and other forms of information that can provide some or all of the above-described capabilities can alternatively be implemented by frame proxy 16.

Figure 4:
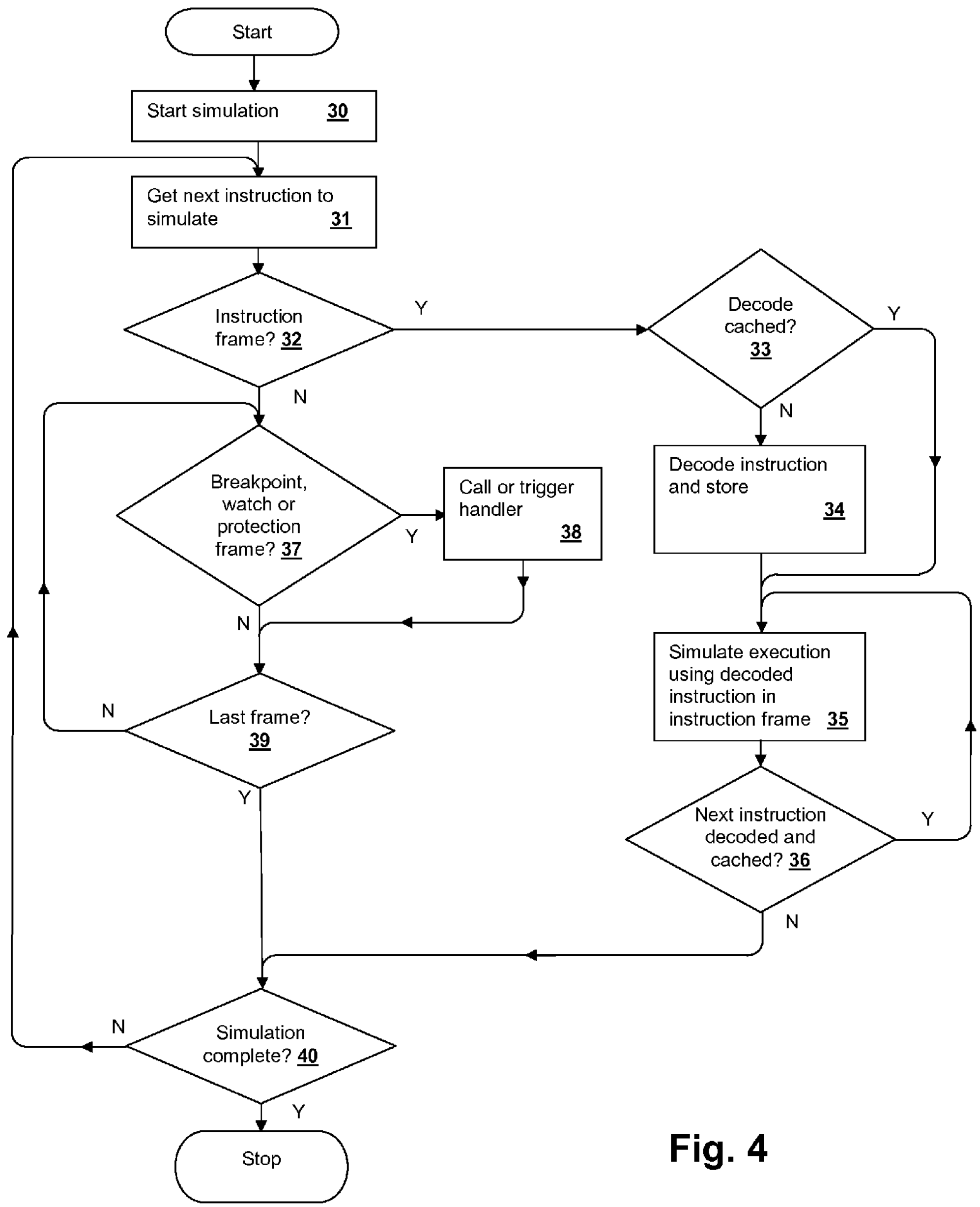
FIG. 4 is a flow chart depicting a method of simulating instruction memory accesses in accordance with an embodiment of the present invention.

Referring now to FIG. 4, a method of managing memory accesses in accordance with an embodiment of the invention is exemplified. The particular method is a simulation method. The simulation is started (step 30) and when a fetch for a next instruction to execute is received (step 31), if the current frame being processed is an instruction frame (decision 32), if a decoded instruction for the program address is not cached (decision 33), then the instruction is retrieved from simulated instruction memory and decoded (step 34). Once the decoded instruction is available, the decoded instruction is simulated (step 35). If the next instruction is decoded and cached (decision 36), steps 35 and 36 are repeated directly without requiring exit of the instruction frame. If the current frame was not an instruction frame (decision 32), if the current frame is a check frame implementing a breakpoint, code watch, or exception entry for the code location (or range containing the code location) (decision 37), then the corresponding handler is called or triggered (step 38). Until the last frame in the chain (linked list) is encountered (decision 39), steps 32-39 are repeated and until the simulation is complete (decision 40) steps 31-39 are repeated.

Figure 5:
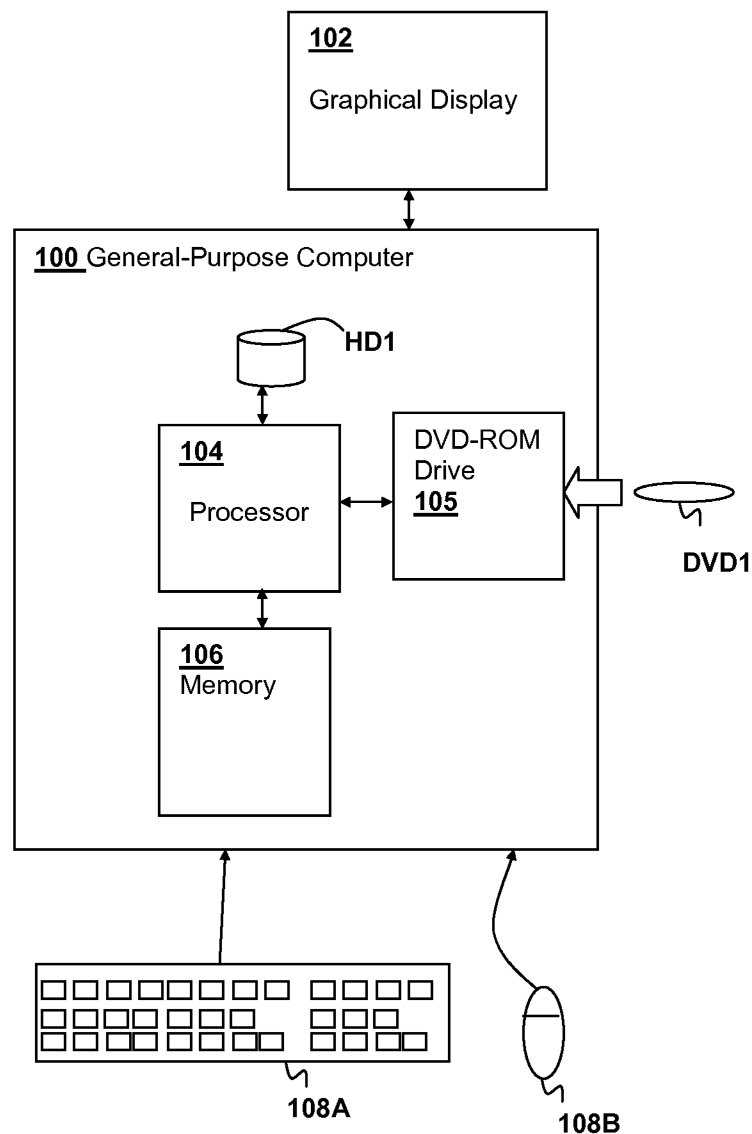
FIG. 5 is a block diagram illustrating a computer system in which program code according to an embodiment of the present invention implementing a method according to an embodiment of the invention is executed.

Referring now to FIG. 5, a computer system in which the above-described computer-performed methods are performed, is shown. A general-purpose computer 100 is coupled to a graphical display 102 for display of simulation results, as well as user interface screens for controlling one or more programs including programs forming computer program products including program instructions for carrying out the methods described above. Input devices such as a keyboard 108A and a mouse 108B provide for user interaction with general-purpose computer 100. General-purpose computer 100 includes a processor 104 for executing program instructions stored in a memory 106 including program instructions forming the above-described computer program products in accordance with embodiments of the invention. A removable storage device, such as a DVD-ROM drive 105 is included for accepting storage media such as DVD-ROM DVD1 forming a computer program product in accordance with an embodiment of the invention. The computer system depicted in FIG. 5 is only one example of a computer system, such as a desktop computer system or a notebook computer system, which can be used to perform the verification described above. Other types of computer systems, including distributed and networked computer systems in which some or all of the algorithms and portions thereof are executed remotely are within the scope of the invention as contemplated herein. The system depicted in FIG. 5 should not be construed as limiting the type of computer system or computer program products that form embodiments of the present invention.

As noted above, portions of the present invention may be embodied in a computer program product, which may include firmware, an image in system memory or another memory/cache, or stored on a fixed or re-writable media such as an optical disc having computer-readable code stored thereon. Any combination of one or more computer-readable medium(s) may store a program in accordance with an embodiment of the invention. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of the present application, a computer-readable storage medium may be any tangible medium that can contain or store a program for use by or in connection with an instruction execution system, apparatus, or device. A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including but not limited to wireless, wireline, optical fiber cable, RF, etc., or any suitable combination of the foregoing.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method of processing simulated accesses to instruction memory by a processor being simulated by a simulation program executing within a computer system, the method comprising:

- receiving, from the processor, a next instruction access request to access an instruction memory location within a frame of the memory of the computer system at a proxy frame corresponding to the instruction memory frame, wherein the instruction memory frame represents a tail of a linked list accessed via the proxy frame;
- if an instruction frame has been inserted in the linked list ahead of the memory frame, processing the access request by the command, wherein the instruction frame provides a buffered decoded instruction to the simulation program; and
- if the instruction frame has not been inserted ahead of the memory frame, processing the access request by the memory frame directly.

2. The method of claim 1, further comprising inserting the instruction frame between the proxy frame and the instruction memory frame upon detecting a first access to the instruction memory frame.

3. The method of claim 1, wherein the processing of the access request comprises fetching an instruction stored at the instruction memory location, and wherein a result of processing the access request is stored in conformity with a result of the fetching, whereby subsequent processing of an access request to the same instruction memory location by the proxy frame does not require fetching the instruction from the memory subsystem.

4. The method of claim 3, wherein the processing of the access request further comprises decoding the instruction, and wherein a result of the decoding is stored by the instruction frame, whereby subsequent processing of the access request by the proxy object does not require decoding the instruction.

5. The method of claim 1, wherein the processing of the access request comprises fetching and decoding an instruction stored at the instruction memory location, and wherein a result of the decoding is stored by the instruction frame, whereby subsequent processing of the access request by the frame proxy does not require fetching the instruction from the memory subsystem and decoding the instruction.

6. The method of claim 5, wherein the processing of the access request further comprises storing a pointer to a next instruction location corresponding to a next instruction previously executed after the instruction, whereby completion of processing of the instruction does not require determining a next instruction to execute.

7. The method of claim 1, wherein the receiving receives the access request at a chain of multiple command and check frames including the instruction frame and one or more other check frames, and wherein each of the one or more check frames performs a separate check on the instruction memory access request.

* * * * *